(12) United States Patent
Lien

(10) Patent No.: US 6,372,641 B1
(45) Date of Patent: Apr. 16, 2002

(54) METHOD OF FORMING SELF-ALIGNED VIA STRUCTURE

(75) Inventor: Chuen-Der Lien, Mountain View, CA (US)

(73) Assignee: Integrated Device Technology, Inc., Santa Clara (*) Notice: Subject to any disclaimer, the term of this patent is extended or adjusted under 35 U.S.C. 154(b) by 1276 days.

(21) Appl. No.: 08/742,704

(22) Filed: Nov. 4, 1996

Related U.S. Application Data

(60) Continuation of application No. 08/341,800, filed on Nov. 18, 1994, now abandoned, which is a division of application No. 08/201,437, filed on Feb. 24, 1994, now Pat. No. 5,471,094.

(51) Int. Cl.⁷ ..................... H01L 21/4763; H01L 21/44; H01L 21/302
(52) U.S. Cl. ................. 438/669; 438/624; 438/637; 438/641; 438/647; 438/649; 438/672; 438/675; 438/738
(58) Field of Search ................ 437/189, 192, 437/193, 195, 200, 228, 924, 984

(56) References Cited

U.S. PATENT DOCUMENTS

| | | | | |
|---|---|---|---|---|
| 4,914,056 A | | 4/1990 | Okumura | 437/192 |
| 4,996,133 A | * | 2/1991 | Brighton et al. | 437/195 |
| 5,026,666 A | * | 6/1991 | Hills et al. | 437/195 |
| 5,084,416 A | * | 1/1992 | Ozaki et al. | 437/195 |
| 5,189,506 A | | 2/1993 | Cronin et al. | 257/752 |
| 5,382,545 A | * | 1/1995 | Hong | 437/228 |
| 5,420,074 A | * | 5/1995 | Ohshima | 437/189 |
| 5,543,360 A | * | 8/1996 | Matsuoka et al. | 437/195 |
| 5,593,920 A | * | 1/1997 | Haslam et al. | 437/195 |

OTHER PUBLICATIONS

S. Wolf, "Silicon Processing For The VLSI Era, vol. 2", Lattice Press, 1990, pp. 222–223, 253.*

* cited by examiner

*Primary Examiner*—Ha Tran Nguyen
(74) *Attorney, Agent, or Firm*—Skjerven, Morrill, et al.

(57) ABSTRACT

A self-aligned via between interconnect layers in an integrated circuit, and a process for forming such a via which allows a less precise masking alignment to be used to fabricate an integrated circuit with increased packing density.

17 Claims, 7 Drawing Sheets

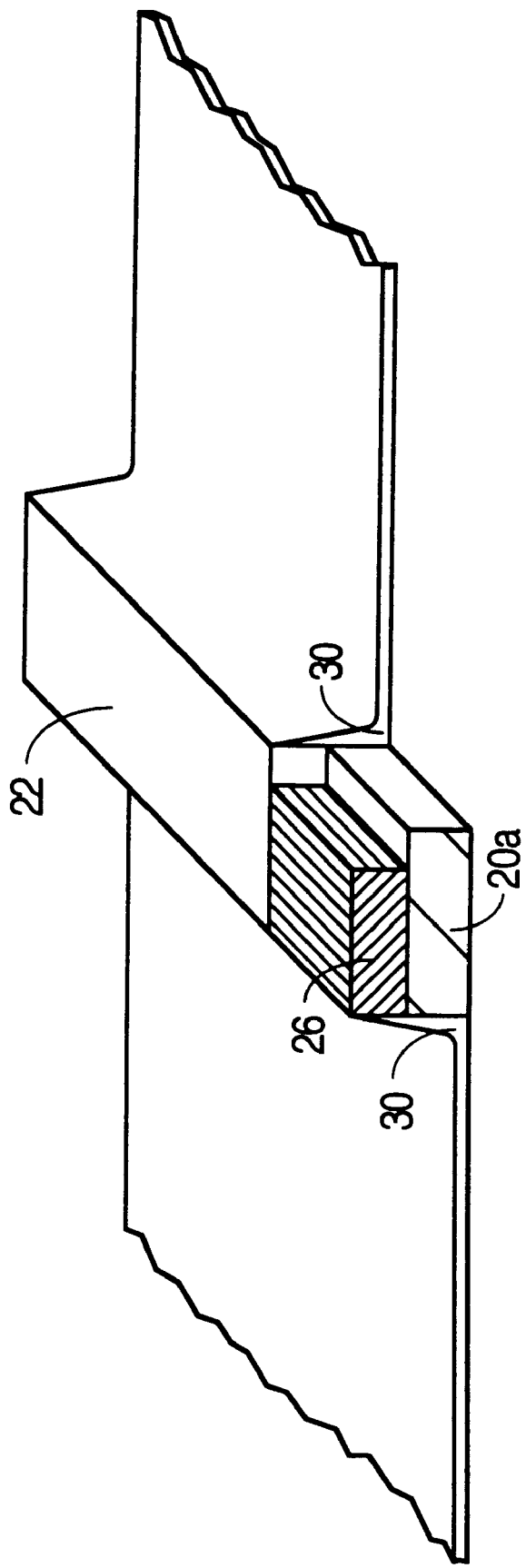

METHOD OF FORMING SELF-ALIGNED VIA STRUCTURE

This application is a continuation of application Ser. No. 08/341,800, filed Nov. 18, 1994, abandoned which is a division of application Ser. No. 08/201,437, filed Feb. 24, 1994, now U.S. Pat. No. 5,471,094.

FIELD OF THE INVENTION

This invention relates to a self-aligned via between interconnect layers in an integrated circuit and to a process for forming such a via.

BACKGROUND OF THE INVENTION

In the fabrication of semiconductor memory devices and other types of integrated circuits, two or more conductive layers known as interconnect layers are commonly deposited. These interconnect layers are separated, for example, by one or more dielectric layers. Various methods may be used to make electrical connections between these interconnect layers. One such method includes (a) forming a first dielectric layer, (b) depositing a first interconnect layer ("Poly 1"), (c) masking and etching Poly 1 to form conductive leads, (d) depositing a second dielectric layer, (e) masking and etching the second dielectric layer to form a "via" (a small opening) completely through the second dielectric layer to a Poly 1 conductive lead, and (f) depositing a second interconnect layer ("Poly 2") in and over the via so that electrical contact between Poly 1 and Poly 2 is made through a "plug" of conductive material which fills the via. One of the difficulties in using this method is that it is necessary to compensate for possible misalignment of the via mask. For example, a misalignment of the via mask may shift the via sideways so that the via is not formed entirely over the Poly 1 conductor. Instead, the via may overlap onto the first dielectric layer alongside a Poly 1 conductor, exposing the first dielectric layer during the via etch step, and allowing a groove to be etched in the first dielectric layer during the via etch step. The groove may cause microcracking or thinning of the Poly 2 conductor when it is deposited in and over the via to contact the Poly 1 conductor. This can be avoided by widening the Poly 1 conductor at the via location so that even a misaligned via will not overlap onto the first dielectric layer. However, locally widening the Poly 1 conductor conflicts with the goal of reducing the size of the integrated circuit and increasing its packing density.

It is desirable to decrease the memory cell size in fabricating semiconductor memory devices such as random access memory chips, in order to increase the packing density. A major factor limiting further increases in packing density is the alignment tolerance of the via mask used in forming a via between Poly 1 and Poly 2.

SUMMARY OF THE INVENTION

In accordance with the present invention, a process is provided for forming a self-aligned via between interconnect layers on an integrated circuit chip. This self-aligned feature permits a less precise masking alignment to be used in forming such a via, without the disadvantage of locally widening the Poly 1 conductor at the via location as in the prior art process described above. In the present invention, the smaller linewidth of the Poly 1 conductor at the via location makes it possible to fabricate an integrated circuit with greater packing density, reduced die size, and improved yield.

In one embodiment, the process of the present invention includes (a) depositing a first conductive layer overlying one surface of a semiconductor substrate, (b) forming a first dielectric layer directly upon the first conductive layer, (c) masking and etching the first dielectric layer to form a via, (d) forming a conductive plug within the via, (e) masking and etching the conductive plug, the first dielectric layer, and the first conductive layer to form an interconnect structure, (f) depositing a second dielectric layer overlying the substrate and the interconnect structure, (g) etching the second dielectric layer to expose the upper surface of the conductive plug, and (h) forming a second interconnect layer overlying the second dielectric layer so that an electrical connection is formed between the first and second interconnect layers. The resulting structure will have a conductive plug formed within the self-aligned via, with one edge of the conductive plug normally being aligned with one edge of the first interconnect layer, and the other edge of the conductive plug either lying above the first interconnect layer or aligned with the other edge of the first interconnect layer. If the via mask is perfectly aligned, both edges of the conductive plug will be aligned with the edges of the first interconnect layer.

DESCRIPTION OF THE DRAWINGS

FIG. 2 shows a cross-sectional perspective view of one embodiment of a self-aligned via in accordance with this invention.

DETAILED DESCRIPTION

Figure 1A:
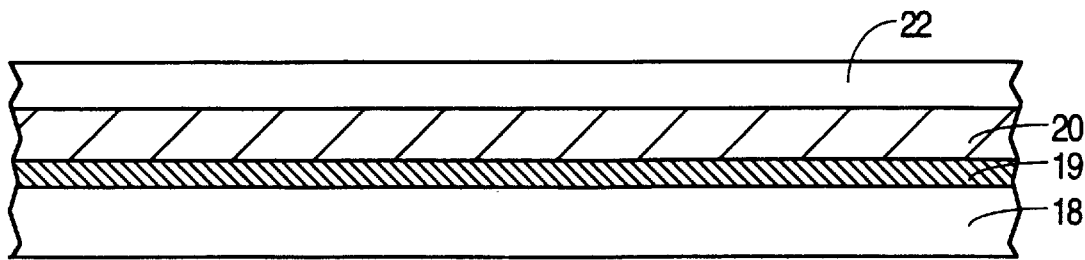
FIGS. 1a through 1g illustrate one process for making a novel self-aligned via in accordance with this invention.

In FIG. 1a, a first conductive layer 20 of any suitable conductive material is deposited overlying one or more other layers on a wafer. Typically, the first conductive layer 20 is formed on a dielectric layer 19 overlying a semiconductor substrate 18 (usually, but not necessarily silicon). For simplicity and clarity, the semiconductor substrate 18 and the dielectric layer 19 are omitted from FIG. 1b through 1g. but it should be understood that elements 18 and 19 are present throughout the described process. The first conductive layer 20 will be formed into a first layer of interconnects at a later step in the process of this invention. In one embodiment, the first conductive layer 20 is formed of polysilicon (polycrystalline silicon) about 2,000 to 3,000 angstroms thick by CVD deposition of silane ($SiH_4$) at a temperature of about 610° C. This polysilicon layer is either formed doped in a standard, well-known manner or is doped by a standard process such as diffusion or ion implantation. A first dielectric layer 22 of silicon dioxide about 3,000 angstroms thick is then formed on layer 20 by thermal oxidation of the polysilicon first conductive layer 20 at a temperature of approximately 410° C.

Figure 1B:
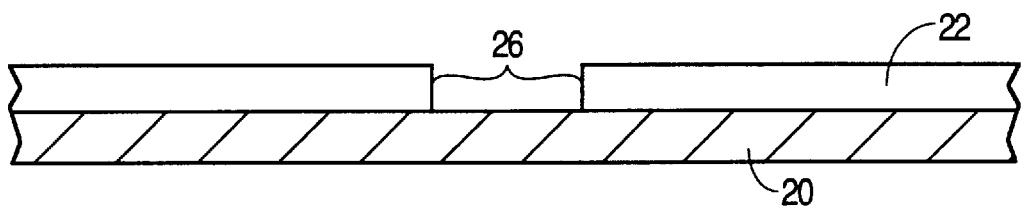

The first dielectric layer 22 is then masked and typically dry etched in a well-known manner to form a via 24, as shown in FIG. 1b.

Figure 1C:
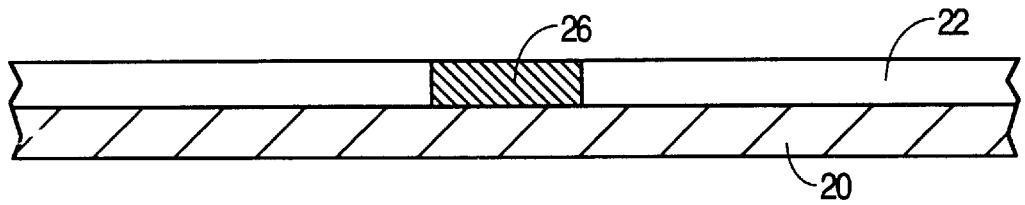

In FIG. 1c, the via 24 is filled with a plug 26 of any suitable conductive material. In one embodiment, the plug 26 is formed of doped polysilicon. Alternatively, plug 26 can be formed of undoped polysilicon, in which case the undoped plug will become doped from outdiffusion of dopant from the first polysilicon conductive layer 20 or from a subsequently formed second polysilicon layer. Alternatively, the plug 26 may be formed of tungsten silicide. The plug 26 may be formed either by selective deposition or by blanket deposition and etchback in a well-known manner. In one embodiment, the plug 26 is about 3,000 angstroms thick.

Figure 1D:
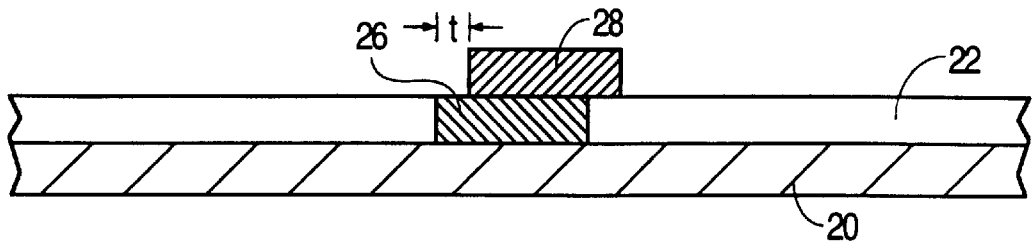

A mask, typically of photoresist 28, is then used to define the conductive lead pattern to be formed from the first conductive layer 20. FIG. 1d shows a cross-sectional view of the resist 28 where it passes over the plug 26. The offset "t" between the resist 28 and the plug 26 is caused by misalignment of the via mask which reflects the inherent inability to exactly align any mask in its desired position on a wafer. The process used to fabricate a semiconductor device must always reflect the tolerances for the alignment on the wafer of the masks used to fabricate the device.

Figure 1E:
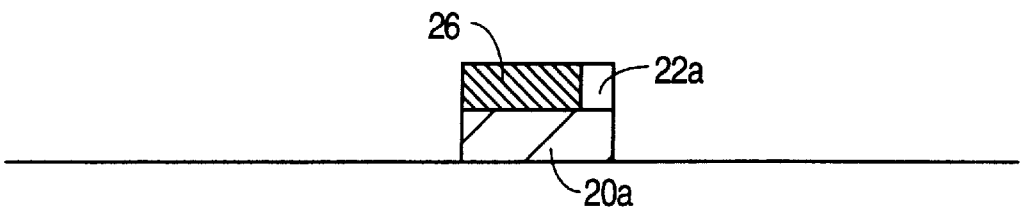

The portions of the first dielectric layer 22, the plug 26, and the first conductive layer 20 which are not protected by the resist are then etched to form (after removal of the resist) an interconnect structure (FIG. 1e). In this etching step, the first conductive layer 20 is etched to form a first interconnect layer. FIG. 1e shows a cross-sectional view of a conductive lead 20a which is part of the first interconnect layer. In one embodiment, the unprotected portions of a first dielectric layer 22 of silicon dioxide, a plug 26 of polysilicon, and a first conductive layer 20 of polysilicon are etched in a two-step process. In the first step, a well-known dry etch process is used to anisotropically etch the unprotected portions of the first dielectric layer 22 and of the plug 26. For example, if the plug 26 is polysilicon, a chlorine or a bromine plasma etch may be used. Alternatively, if the plug 26 is tungsten silicide, a fluorine plasma etch may be used. If a composite tungsten silicide-polysilicon plug is used, a fluorine plasma etch is used, followed by either a chlorine or bromine plasma etch. In the second step, a dry etch process is used to anisotropically etch the unprotected portion of the first conductive layer 20. Typically, a fluorine plasma is used to initiate the etch, a mixture of chlorine and bromine plasma is used to etch the bulk of the polysilicon, and bromine plasma (which is highly selective and preferentially etches polysilicon 50 to 100 times faster than it etches silicon dioxide) is used in the final overetch step to remove the residual polysilicon.

Due to the misalignment of the via mask, the left edge of plug 26 is etched away so that the plug is narrower than the conductive lead 20a, leaving a small pocket 22a of the first dielectric layer 22 next to the plug. In contrast with the prior art, misalignment of the via mask does not cause any significant harmful effect as long as the etching step does not remove so much of the plug 26 that the plug 26 is no longer an effective conductor between the first interconnect layer and a second interconnect layer to be formed in a later step. This is a unique feature of this invention, permitting the use of a less precise via mask alignment than would normally be required.

Figure 1F:
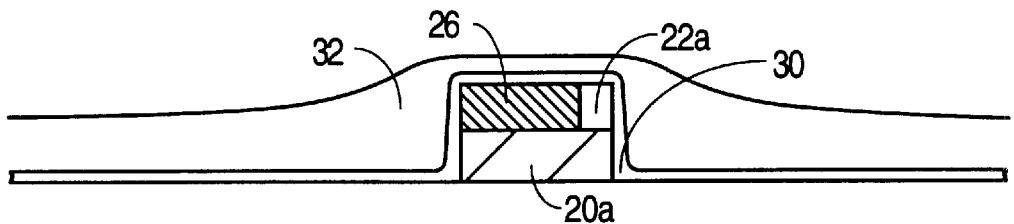
Figure 1G:
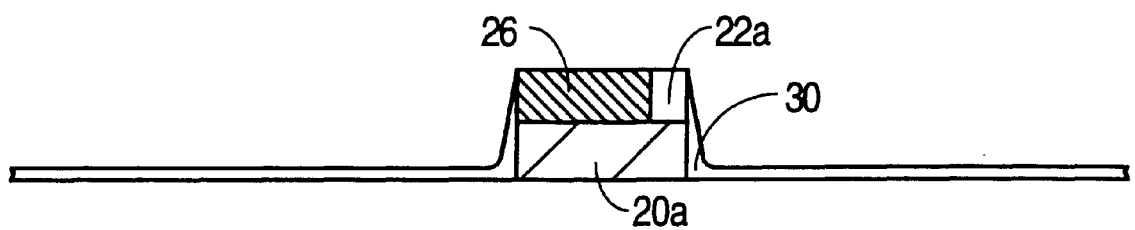

In FIG. 1f, a second dielectric layer 30 is then deposited to a selected thickness. In one embodiment, the second dielectric layer 30 is formed of silicon dioxide about 1,000 to 1,500 angstroms thick by plasma enhanced CVD. A sacrificial layer 32 of a material such as photoresist or spin-on-glass is formed on the wafer to protect the portion of the second dielectric layer 30 over the active regions of the underlying semiconductor substrate 18 and dielectric layer 19 (FIG. 1a) while allowing the portion of the second dielectric layer 30 which is directly above the plug 26 to be etched away to expose the top surface of the plug 26. As shown in FIG. 1g, the remainder of the photoresist sacrificial layer 32 is then typically stripped in a dry etch process using oxygen plasma followed by sulfuric peroxide. Alternatively, if spin-on-glass is used as a sacrificial layer, it may either be left on the wafer or removed by using hydrogen fluoride.

In one embodiment, the polysilicon conductive lead 20a forms the gate of an MOS transistor. The thickness of both the plug 26 and the sacrificial layer 32 are therefore selected so that the sacrificial layer will be thinner over the plug than over the source and drain regions. Thus, the portion of the sacrificial layer 32 and of the second dielectric layer 30 which is directly above the plug 26 may be masked and etched (for example, by using a dry plasma etch) to expose the top surface of the plug, while the sacrificial layer 32 protects the second dielectric layer 30 over the source and drain regions. Alternatively, well-known chemical mechanical polishing ("CMP") may be used to expose the top surface of the plug 26, thus avoiding the need for a sacrificial layer (although the sacrificial layer may still be used). In this embodiment, it may be desirable not to form the plug 26 directly above the gate of an MOS device if the plug would be sufficiently close to the source or drain contact to cause shorting.

FIG. 2 shows a cross-sectional view of one embodiment of a self-aligned via and plug in accordance with this invention. In this view, the small pocket 22a of the first dielectric layer 22 next to the plug 26 has been removed to more clearly show the structure of the conductive lead 20a (which is part of the first interconnect layer) and of the plug 26.

Figure 3:
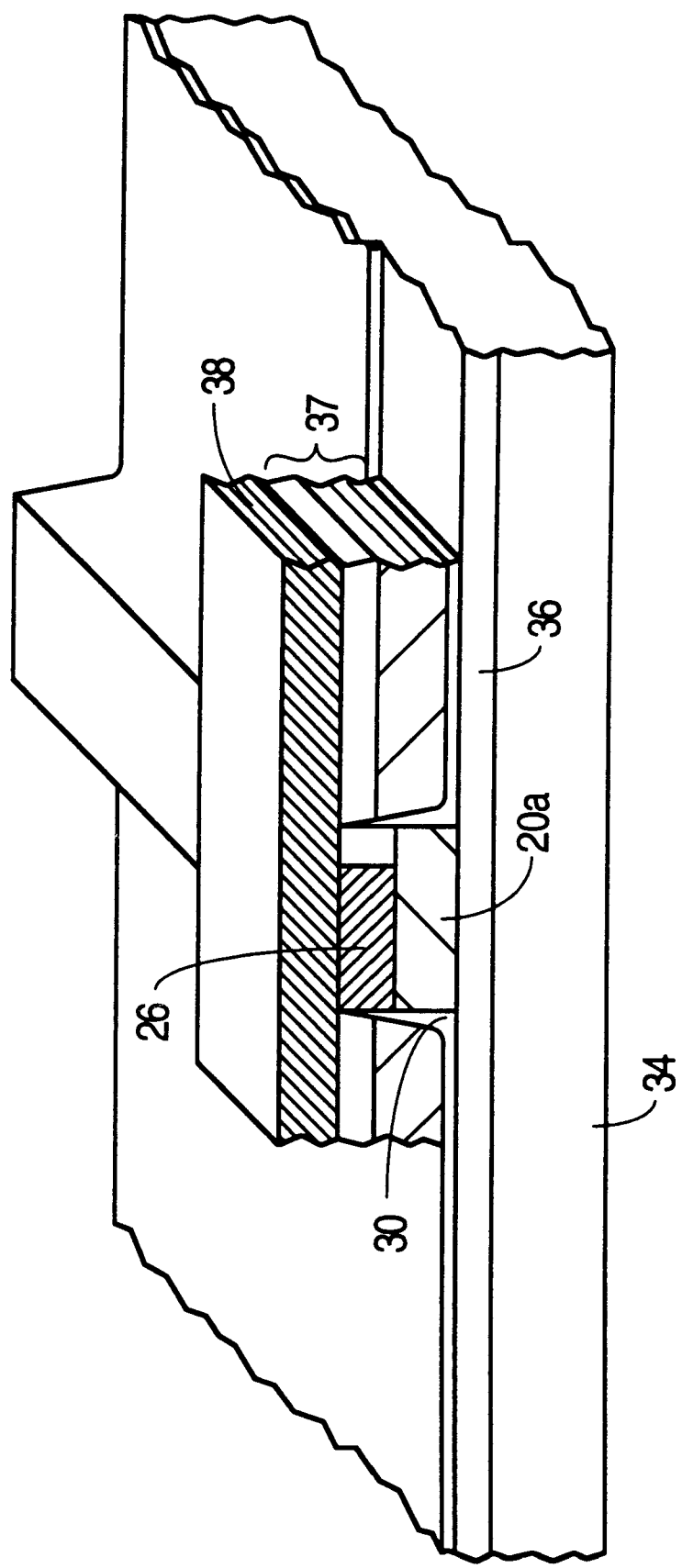
FIG. 3 shows a cross-sectional perspective view of a second embodiment of a self-aligned via in accordance with this invention.

FIG. 3 shows a partial cross-sectional view of a second embodiment of a self-aligned via and plug in accordance with this invention. This view shows the substrate 34 and a dielectric layer 36 which is formed overlying the substrate before the self-aligned via and plug are formed. This view also shows one or more intervening layers 37 (typically including an additional dielectric layer) which are formed overlying the second dielectric layer 30 prior to the formation of a second interconnect layer. In this view, a second conductive lead 38 (which is part of a second interconnect layer formed in a manner well known in the art) contacts the top surface of the plug 26, so that an electrical connection is formed between the first and second interconnect layers. (FIG. 3 is intended to show only the manner in which the second conductive lead 38 contacts the top of the plug 26. For clarity, only those portions of the second conductive lead 38 and the intervening layers 37 are shown which are adjacent to the plug 26, with the remaining portions stripped away.)

Figure 4:
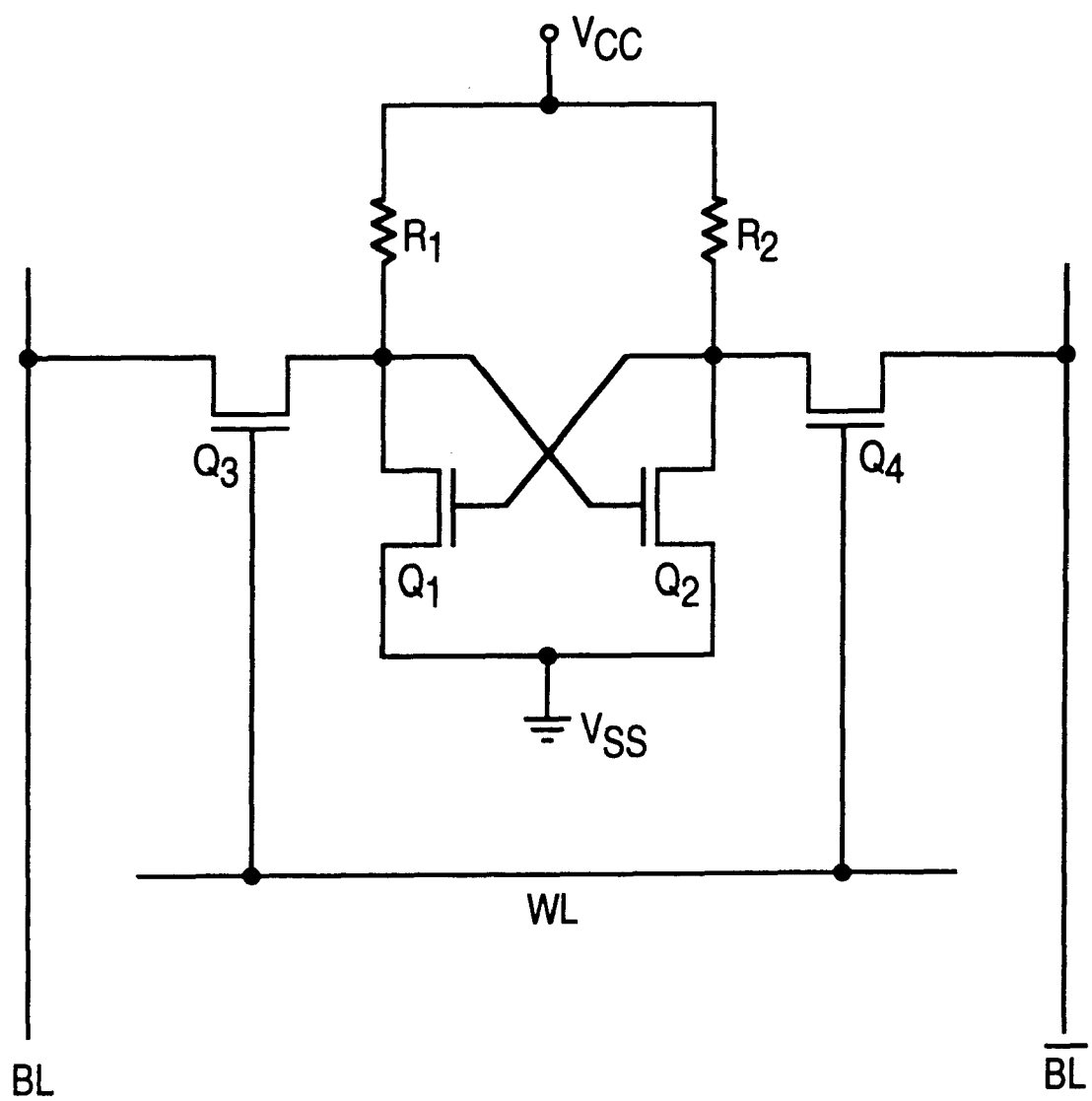
FIGS. 4 and 5 show a schematic diagram and a layout of an SRAM memory cell fabricated by using self-aligned vias in accordance with this invention.
Figure 5:
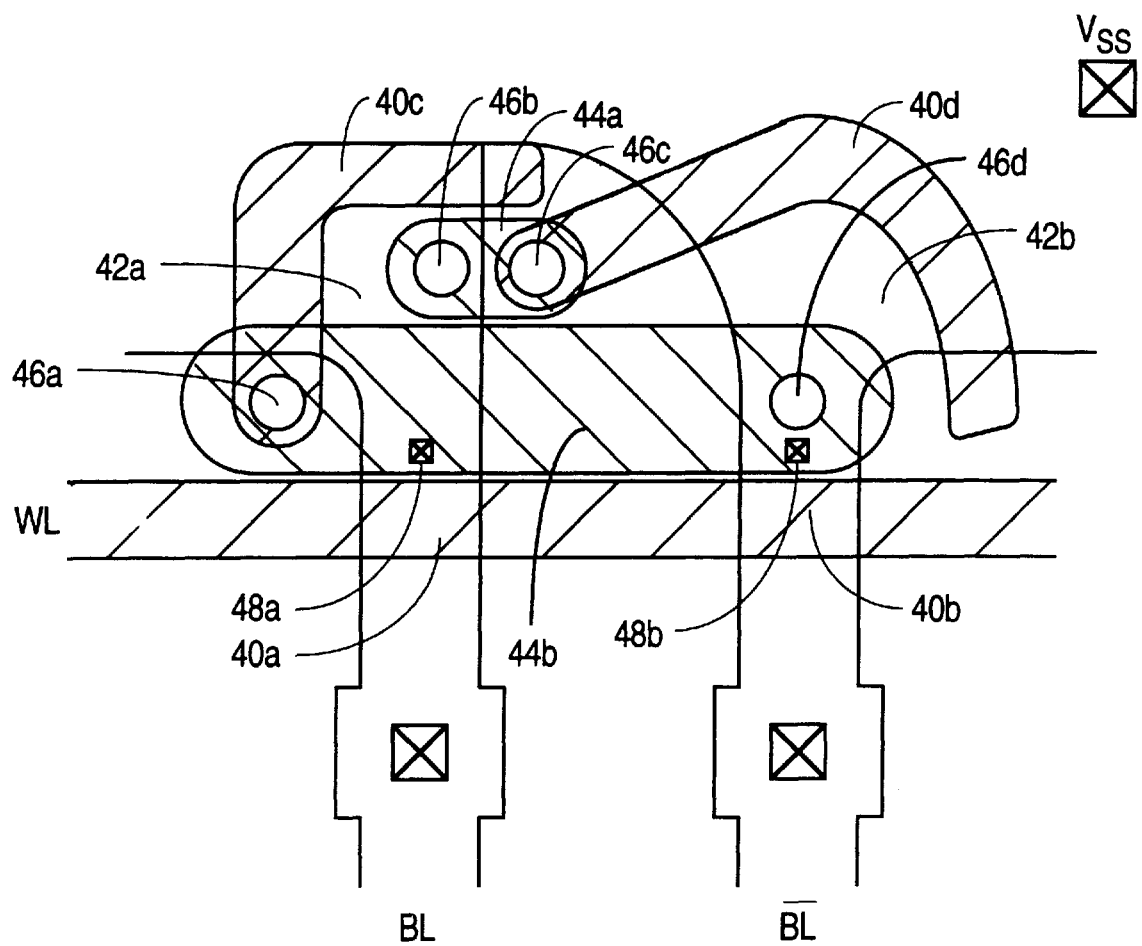

FIGS. 4 and 5 show a schematic diagram and a layout of a poly-load SRAM memory cell fabricated by using self-aligned vias according to one embodiment of this invention. The memory cell, which is well known in the art, includes NMOS access transistors $Q_3$ and $Q_4$, NMOS driver transistors $Q_1$. and $Q_2$, and high-valued load resistors $R_1$, and $R_2$. As shown in FIG. 5, the gates 40a–40d of transistors $Q_1$–$Q_4$ are formed in the first polysilicon layer ("Poly 1"), which is heavily doped. NMOS transistors $Q_1$, and $Q_3$ share a common drain 42a, and NMOS transistors $Q_2$ and $Q_4$ share a common drain 42b. The load resistors $R_1$, and $R_2$ (not shown in FIG. 5) are formed in a lightly doped portion of the second polysilicon layer ("Poly 2"). The remainder of the Poly 2 layer is implanted with a much higher dopant concentration and patterned to form a low resistance interconnect layer which includes conductive leads 44a and 44b (FIG. 5).

FIG. 5 illustrates the use of self-aligned vias in the above described SRAM memory cell in accordance with this invention. The connection between the Poly 1 gate 40c of transistor $Q_1$, and the common drain 42b of transistors $Q_2$ and $Q_4$ is made through the self-aligned via 46a, the Poly 2 conductive lead 44b, and the self-aligned via 46d. The connection between the Poly 1 gate 40d of transistor $Q_2$ and the common drain 42a of transistors $Q_1$, and $Q_3$ is made through the self-aligned via 46c, the Poly 2 conductive lead 44a, and the self-aligned via 46b. The drain 42a of transistor $Q_3$ and the drain 42b of transistor $Q_4$ are connected to Poly 2 resistors $R_1$, and $R_2$ (not shown) through buried contacts 48a and 48b. Finally, the common source of transistors $Q_1$, and $Q_2$ is contacted through buried contact $V_{ss}$.

Significant advantages are achieved by using self-aligned vias in SRAM memory cells according to the present invention. For example, in the embodiment of FIGS. 4 and 5, it is possible to reduce the device area by approximately 10% compared to the prior art, resulting in a 7% increase in yield.

This invention has been described using polysilicon for the conductive interconnect layers. However, other suitable materials, such as polycides, silicides, or metals (such as aluminum, titanium, tungsten or combinations thereof) may be used to form one or more of the interconnect layers, depending on the processing temperatures and other requirements of the particular process. The drawings are illustrative of one embodiment, and are not intended to be limiting; for example, the plug 26 may be round or another shape (referring to a cross-sectional top view of the plug), rather than rectangular as shown in FIG. 2. Further, other suitable semiconductors such as gallium arsenide may be used as substrates. It should be understood that this invention, although advantageous for memory cells and particularly SRAM memory cells, is not limited to the use of self-aligned vias in semiconductor memory devices, but may be used to form electrical connections between interconnect layers in virtually any integrated circuit.

Other embodiments of the invention will be apparent to persons skilled in the art upon considering this specification or practicing the invention disclosed herein. It is intended that the specification and examples be considered as exemplary only, with the full scope of the invention being indicated by the following claims.

What is claimed is:

1. A process for forming an interconnect structure comprising:

depositing a first conductive layer overlying one surface of a substrate;

forming a first dielectric layer overlying said first conductive layer;

forming a via in said first dielectric layer;

forming a first conductive plug within said via; and selectively removing a first portion of said first conductive plug and a first portion of said first dielectric layer to form a second conductive plug in contact with a dielectric region;

selectively removing a first portion of said first conductive layer thereby forming an interconnect structure comprising a second conductive plug having an upper surface and a lateral surface, a first conductive lead having a top surface and a second portion that extends beyond said lateral surface of said second conductive plug, wherein said dielectric region is located on the top surface of said first conductive lead.

2. A process as in claim 1 wherein said first conductive lead is one of a plurality of conductive leads which form a first interconnect layer.

3. A process as in claim 2 wherein said first interconnect layer comprises polysilicon.

4. A process as in claim 1 further comprising:

depositing a second dielectric layer above said interconnect structure; and selectively removing a portion of said second dielectric layer to expose said upper surface of said second conductive plug.

5. A process as in claim 4 wherein said first and second dielectric layers comprise silicon dioxide.

6. A process as in claim 4, further comprising depositing, masking, and etching a second conductive layer to form a second conductive lead overlying said second dielectric layer, wherein said second conductive lead contacts said upper surface of said second conductive plug.

7. A process as in claim 6 wherein said second conductive lead is one of a plurality of conductive leads which form a second interconnect layer.

8. A process as in claim 7 wherein said second interconnect layer comprises polysilicon.

9. A process as in claim 8 wherein said first and second dielectric layers comprise silicon dioxide.

10. A process as in claim 9 wherein a sacrificial layer is formed over said second dielectric layer.

11. The process of claim 10, wherein said sacrificial layer is formed prior to selectively removing a portion of said second dielectric layer.

12. The process of claim 11, wherein said selectively removing of a portion of said second dielectric layer comprises etching a first portion of said sacrificial layer and a first portion of said second dielectric layer directly above said second conductive plug to expose said upper surface of said second conductive plug.

13. A process as in claim 12 wherein a second portion of said sacrificial layer protects the remaining portion of said second dielectric layer during etching.

14. A process as in claim 10 wherein said upper surface of said second conductive plug is substantially level with an upper surface of said first dielectric layer.

15. A process as in claim 14 wherein said first conductive plug is formed by selective deposition.

16. A process as in claim 14 wherein said first conductive plug is formed by blanket deposition and etchback.

17. A process as in claim 10 wherein said sacrificial layer is selected from the group consisting of photoresist and spin-on-glass.

\* \* \* \* \*